(12) United States Patent
Fu

(10) Patent No.: US 9,306,587 B2
(45) Date of Patent: Apr. 5, 2016

(54) OSCILLATOR CIRCUIT AND CONFIGURATION METHOD THEREOF

(71) Applicant: Semiconductor Manufacturing International (Shanghai) Corporation, Shanghai (CN)

(72) Inventor: Zhigang Fu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/716,879

(22) Filed: May 20, 2015

(65) Prior Publication Data

US 2015/0349789 A1 Dec. 3, 2015

(30) Foreign Application Priority Data

May 28, 2014 (CN) .......................... 2014 1 0230774

(51) Int. Cl.
*H03L 7/24* (2006.01)
*H03B 5/24* (2006.01)
*H03B 5/12* (2006.01)

(52) U.S. Cl.
CPC .. *H03L 7/24* (2013.01); *H03B 5/12* (2013.01); *H03B 5/24* (2013.01)

(58) Field of Classification Search
CPC .......................................................... H03L 7/24
USPC ..................................................... 331/18, 1 A
See application file for complete search history.

(56) References Cited

U.S. PATENT DOCUMENTS

| 6,744,323 B1 * | 6/2004 | Moyal ........................ H03L 7/10 331/1 A |
| 2007/0120611 A1 * | 5/2007 | Kim ...................... H03D 13/003 331/25 |

* cited by examiner

*Primary Examiner* — Joseph Chang
(74) *Attorney, Agent, or Firm* — Anova Law Group, PLLC

(57) ABSTRACT

The present disclosure provides an oscillator circuit. The oscillator circuit includes a signal selecting unit, a control voltage generating unit, a reference voltage generating unit, an output adjusting unit, and a frequency-dividing unit. The signal selecting unit is configured to select a reference signal or a frequency-divided signal as an input signal. The control voltage generating unit is configured to generate a control voltage based on the input signal. The reference voltage generating unit is configured to generate a reference voltage. The output adjusting unit is configured to generate an output signal based on the control voltage and the reference voltage. The frequency-dividing unit is configured to divide the frequency of the output signal and generate the frequency-divided signal.

20 Claims, 4 Drawing Sheets

OSCILLATOR CIRCUIT AND CONFIGURATION METHOD THEREOF

CROSS-REFERENCES TO RELATED APPLICATIONS

This application claims the priority of Chinese Patent Application No. 201410230774.3, filed on May 28, 2014, the entire content of which is incorporated herein by reference.

ART OF THE DISCLOSURE

The present disclosure generally relates to the field of integrated circuit (IC) technology and, more particularly, relates to oscillator circuit.

BACKGROUND

An oscillator is an electronic device that can produce a periodic, oscillating electronic signal. A circuit with an oscillator is called an oscillator circuit. There are many types of oscillators. For example, categorized by the method of excitation, there are self-excited oscillators and separately excited oscillators. Categorized by the circuit structure, there are RC (resistor-capacitor) oscillators, LC (resistor-inductor) oscillators, crystal oscillators, and ring oscillators, and tuning fork oscillators. Further, categorized by the output waveform, there are sine-wave oscillators, square-wave oscillators, sawtooth oscillators. Oscillator circuits are commonly used in devices for telecommunication, broadcasting, television, etc. Widely used oscillator circuits include RC oscillator circuits, ring oscillator circuits, and crystal oscillator circuits.

RC oscillator circuits are among the most popular oscillator circuits. An RC oscillator circuit has a simple circuit structure with low production cost and low power consumption. However, performance of an RC oscillator circuit is often closely correlated to the device parameters. The output frequency of an RC oscillator circuit can be significantly affected by the working voltage. Thus, the output frequency of an RC oscillator circuit can sometimes have low accuracy. Ring oscillators have low production cost and the frequency range of the output signal can be considerably wide. However, a ring oscillator circuit can be very sensitive to noises from power supply, and the output frequency of a ring oscillator can also have low accuracy. Crystal oscillator circuits are stably operated, and the accuracy of the output frequency of a crystal oscillator circuit is only determined by the natural frequency of the selected crystal device, so the output frequency normally has a higher accuracy. However, a crystal oscillator circuit often takes up a considerably large area and is not able to be integrated within a chip. In addition, when a quartz crystal is used, production cost can be high.

As can be seen, among the three most commonly used oscillator circuits, RC oscillator circuits and ring oscillator circuits have relatively low production cost, but have low output frequency accuracy. Crystal oscillator circuits have high output frequency accuracy, but also have high production cost. Therefore, a low-cost oscillator circuit with high output frequency accuracy is desired.

BRIEF SUMMARY OF THE DISCLOSURE

The present disclosed method and system are directed to improve, for example, the high cost and low output frequency accuracy of conventional oscillator circuits.

One aspect of the present disclosure provides an oscillator circuit. The oscillator circuit includes a signal selecting unit, a control voltage generating unit, a reference voltage generating unit, an output adjusting unit, and a frequency-dividing unit. The signal selecting unit is configured to select a reference signal or a frequency-divided signal as an input signal. The control voltage generating unit is configured to generate a control voltage based on the input signal, wherein the control voltage has a value associated with a frequency of the input signal. The reference voltage generating unit is configured to generate a reference voltage, wherein the reference voltage has a value equal to the value of the control voltage when the input signal is the reference signal. The output adjusting unit is configured to generate an output signal based on the control voltage and the reference voltage, wherein the output signal has a frequency associated with a voltage difference between the reference voltage and the control voltage, and the frequency of the output signal maintains unchanged if the voltage difference is zero. The frequency-dividing unit is configured to divide the frequency of the output signal and generate the frequency-divided signal.

Another aspect of the present disclosure provides a method for configuring an oscillator circuit. The method includes configuring a signal selecting unit to select a reference signal or a frequency-divided signal as an input signal and configuring a control voltage generating unit to generate a control voltage based on the input signal. The control voltage has a value associated with a frequency of the input signal. The method also includes configuring a reference voltage generating unit to generate a reference voltage and configuring an output adjusting unit to generate an output signal based on the control voltage and the reference voltage. The reference voltage has a value equal to the value of the control voltage when the input signal is the reference signal. The output signal has a frequency associated with a voltage difference between the reference voltage and the control voltage, and the frequency of the output signal maintains unchanged if the voltage difference is zero. The method further includes configuring a frequency-dividing unit to divide the frequency of the output signal and generate the frequency-divided signal.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

To reduce production cost and to improve output frequency accuracy of oscillator circuits, the present disclosure provides an oscillator circuit. The oscillator circuit may include a closed-loop circuit in order to control and correct the output frequency of the circuit in real time. Thus, the frequency of the output signal can be improved to have high accuracy and the production cost of the circuit can be reduced.

Figure 1:
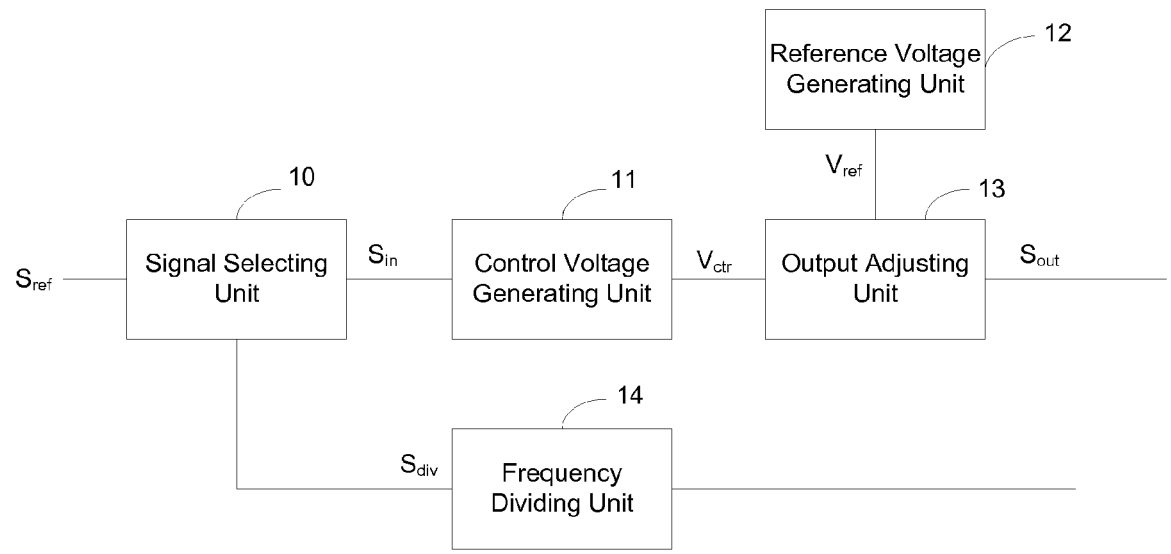
FIG. 1 illustrates an exemplary oscillator circuit consistent with various disclosed embodiments.

FIG. 1 illustrates an exemplary oscillator circuit consistent with the disclosed embodiments. The oscillator circuit includes a signal selecting unit 10, a control voltage generating unit 11, a reference voltage generating unit 12, an output adjusting unit 13, and a frequency-dividing unit 14.

For example, the oscillator circuit can be operated at a reference voltage setup stage and an output signal generating stage. The signal selecting unit 10 can select one signal from the reference signal $S_{ref}$ and the frequency-divided signal $S_{div}$ as the input signal $S_{in}$, in order to switch the working stage of the oscillator circuit between the reference voltage setup stage and the output signal generating stage. Further, at the reference voltage setup stage, the signal selecting unit 10 selects the reference signal $S_{ref}$ as the input signal $S_{in}$; and at the output signal generating stage, the signal selecting unit 10 selects the frequency-divided signal $S_{div}$ as the input signal $S_{in}$. The signal selecting unit 10 can include devices with switching functions (e.g., transistors or/and mechanical switches) to switch between the two stages.

The control voltage generating unit 11 can be configured to generate a control voltage $V_{ctr}$ based on the input signal $S_{in}$. The value of control voltage $V_{ctr}$ may be associated with the frequency of the input signal $S_{in}$, and the value of $V_{ctr}$ can vary according to a varying frequency of the input signal $S_{in}$. It should be noted that, embodiments of the present disclosure should not limit the correlation between the value of the control voltage $V_{ctr}$ and the frequency of the input signal $S_{in}$ to a specific correlation. For example, the control voltage $V_{ctr}$ can be negatively correlated to the frequency of the input signal $S_{in}$. That is, the value of the control voltage $V_{ctr}$ can be decreased according to an increased frequency of the input signal $S_{in}$. Similarly, the value of the control voltage $V_{ctr}$ can be increased according to a decreased frequency of the input signal $S_{in}$. Also, the control voltage $V_{ctr}$ can be positively correlated to the frequency of the input signal $S_{in}$. That is, the value of the control voltage $V_{ctr}$ can increase according to an increased frequency of the input signal $S_{in}$. Similarly, the value of the control voltage $V_{ctr}$ can be decreased according to a decreased frequency of the input signal $S_{in}$.

The reference voltage generating unit 12 can be configured to generate a reference voltage $V_{ref}$. The value of the reference voltage $V_{ref}$ is equal to the value of the $V_{ctr}$ when the input signal $S_{in}$ is $S_{ref}$. Specifically, at the reference voltage generating stage, the signal selecting unit 10 can select the reference signal $S_{ref}$ as the input signal $S_{in}$, and the voltage control unit 11 can generate the control voltage $V_{ctr}$ according to the reference signal $S_{ref}$. The value of the control voltage $V_{ctr}$ may be associated with the frequency of the reference signal $S_{ref}$, and the value of the control voltage $V_{ctr}$ can be the value of the reference voltage $V_{ref}$. By adjusting the circuit parameters of the reference voltage generating unit 12, value of the reference voltage $V_{ref}$ can be obtained. In various embodiments of the present disclosure, an external analog-digital converter or an internal analog-digital converter can be used to access the value of the control voltage $V_{ctr}$.

The output adjusting unit 13 can be configured to generate an output signal $S_{out}$ based on the values of the control voltage $V_{ctr}$ and the reference voltage $V_{ref}$. The frequency of the output signal $S_{out}$ may be associated with the voltage difference between the reference voltage $V_{ref}$ and the control voltage $V_{ctr}$ (i.e., $(V_{ref}-V_{ctr})$). If $(V_{ref}-V_{ctr})$ is equal to zero, the frequency of the output signal $S_{out}$ maintains unchanged. Further, the correlation between the frequency of the output signal $S_{out}$ and the voltage difference between $V_{ref}$ and $V_{ctr}$ (i.e., $(V_{ref}-V_{ctr})$) may be associated with the correlation between the value of the control voltage $V_{ctr}$ and frequency of the input signal $S_{in}$.

For example, the control voltage $V_{ctr}$ can be negatively correlated to the frequency of the input signal $S_{in}$. That is, if the voltage difference between $V_{ref}$ and $V_{ctr}$ (i.e., $(V_{ref}-V_{ctr})$) is greater than zero, the frequency of the output signal $S_{out}$ decreases. If the voltage difference between $V_{ref}$ and $V_{ctr}$ (i.e., $(V_{ref}-V_{ctr})$) is less than zero, the frequency of the output signal $S_{out}$ increases. The control voltage $V_{ctr}$ can also be positively correlated to the frequency of the input signal $S_{in}$. That is, if the voltage difference between $V_{ref}$ and $V_{ctr}$ is greater than zero, the frequency of the output signal $S_{out}$ increases. If the voltage difference between $V_{ref}$ and $V_{ctr}$ (i.e., $(V_{ref}-V_{ctr})$) is less than zero, the frequency of the output signal $S_{out}$ decreases.

The frequency-dividing unit 14 can divide the frequency of the output signal $S_{out}$ to generate a frequency-divided signal $S_{div}$. The frequency of the output signal $S_{out}$ is equal to the frequency of the frequency-divided signal $S_{div}$ multiplied by M, where M is an integer for dividing frequency (or a frequency-dividing integer).

In one embodiment, when the disclosed oscillator circuit is in operation, the value of the control voltage $V_{ctr}$ and the frequency of the input signal $S_{in}$ are positively correlated.

At the reference voltage setup stage, the signal selecting unit 10 can select the reference signal $S_{ref}$ as the input signal $S_{in}$, and the control voltage $V_{ctr}$ can be positively correlated to the frequency of the reference signal $S_{ref}$. The value of the control voltage $V_{ctr}$ can reflect the value of the reference voltage $V_{ref}$. By adjusting the circuit parameters of the reference voltage generating unit 12, the value of the reference voltage $V_{ref}$ can be obtained. After the reference voltage $V_{ref}$ is generated by the reference voltage generating unit 12, the output adjusting unit 13 can start to generate the output signal $S_{out}$. The oscillator circuit is now operating at the output signal generating stage.

At the output signal generating stage, the signal selecting unit 10 can select the frequency-divided signal $S_{div}$ as the input signal $S_{in}$, and the value of the control voltage $V_{ctr}$ is positively correlated to the frequency of the frequency-divided signal $S_{div}$. When the frequency-divided signal $S_{div}$ is less than the reference signal $S_{ref}$, the control voltage $V_{ctr}$ is less than the reference voltage $V_{ref}$. That is, if the voltage difference between $V_{ref}$ and $V_{ctr}$ (i.e., $(V_{ref}-V_{ctr})$) is greater than zero, the output adjusting unit 13 can adjust the frequency of the output signal $S_{out}$ to increase the frequency of the output signal $S_{out}$. After the frequency of the output signal $S_{out}$ is increased, the frequency of the frequency-divided signal $S_{div}$ can be increased accordingly. The control voltage $V_{ctr}$ can be increased, and the voltage difference between $V_{ref}$ and $V_{ctr}$ (i.e., $(V_{ref}-V_{ctr})$) can be decreased. When the voltage difference between $V_{ref}$ and $V_{ctr}$ (i.e., $(V_{ref}-V_{ctr})$) decreases to zero, the control voltage $V_{ctr}$ and the reference voltage $V_{ref}$ can become equal. The frequency of the output signal $S_{out}$ then can maintain unchanged and the oscillator circuit arrives at a stable state. Because the reference voltage $V_{ref}$ and the control voltage $V_{ctr}$ can both be generated by the control voltage generating unit 11, the frequencies of the frequency-divided signal $S_{div}$ and the reference signal $S_{ref}$ can be equal at the stable state. Thus, the frequency of the output signal $S_{out}$ can be equal to the frequency of the reference signal $S_{ref}$ multiplied by the frequency-dividing integer M.

Similarly, when the frequency of the frequency-divided signal $S_{div}$ is greater than the frequency of the reference signal $S_{ref}$, the value of the control voltage $V_{ctr}$ can be greater than the value of the reference voltage $V_{ref}$. That is, if the voltage difference between $V_{ref}$ and $V_{ctr}$ (i.e., $(V_{ref}-V_{ctr})$) is less than zero, the output adjusting unit 13 can adjust the frequency of the output signal $S_{out}$ to decrease. After the frequency of the output signal $S_{out}$ is decreased, the frequency of the frequency-divided signal $S_{div}$ can be decreased accordingly. The control voltage $V_{ctr}$ can be decreased, and the absolute value of the voltage difference between $V_{ref}$ and $V_{ctr}$ (i.e., $(V_{ref}-V_{ctr})$) can be decreased. When the absolute value of the voltage difference between $V_{ref}$ and $V_{ctr}$ (i.e., $(V_{ref}-V_{ctr})$) decreases to zero, the control voltage $V_{ctr}$ and the reference voltage $V_{ref}$ can become equal. The frequency of the output signal $S_{out}$ can maintain unchanged and the oscillator circuit arrives at a stable state.

When the value of the control voltage $V_{ctr}$ and the frequency of the input signal $S_{in}$ are negatively correlated, the working principle of the oscillator circuit is similar to the working principle as described above. Different from a conventional oscillator circuit, the oscillator circuit provided in the present disclosure uses known components without using an oscillating crystal, and the production cost of the circuit can be reduced. Meanwhile, the oscillator circuit provided in the present disclosure uses a closed-loop, such that the value of the control voltage $V_{ctr}$ can vary with the frequency of the output signal $S_{out}$. When the frequency of the output signal $S_{out}$ varies, the output adjusting unit 13 can correct the output signal $S_{out}$ based on the value of the control voltage $V_{ctr}$ in real time. The frequency of the output signal $S_{out}$ can thus have an improved accuracy. The values of the reference voltage $V_{ref}$ and the control voltage $V_{ctr}$ can both be generated by the control voltage generating unit 11, such that frequency errors caused by device deviations can be reduced. The frequency of the output signal $S_{out}$ can be further improved.

Embodiments are further explained in detail to illustrate the working principles of the oscillator circuit provided in the present disclosure. In the embodiments, the value of the control voltage $V_{ctr}$ and the frequency of the input signal $S_{in}$ are positively correlated.

Figure 2:
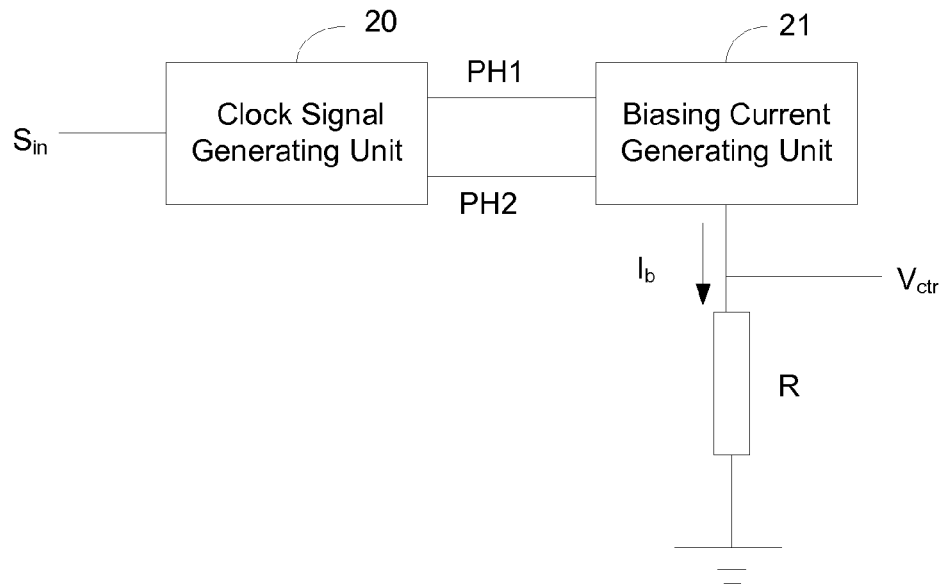
FIG. 2 illustrates an exemplary control voltage generating unit consistent with various disclosed embodiments.

FIG. 2 illustrates structure of an exemplary control voltage generating unit 11. The control voltage generating unit 11 can include a clock signal generating unit 20, a biasing current generating unit 21, and a resistor R.

Specifically, the clock signal generating unit 20 can be configured to generate non-overlapping first clock signal PH1 and second clock signal PH2 based on the input signal $S_{in}$. For example, the first clock signal PH1 and the second clock signal PH2 can have equal frequencies but different phases. At the reference voltage setup stage, the clock signal generating unit 20 can generate the first clock signal PH1 and the second clock signal PH2 based on the frequency of the reference signal $S_{ref}$, and the frequencies of the first clock signal PH1 and the second clock signal PH2 are both equal to the frequency of the reference signal $S_{ref}$. At the output signal generating stage, the clock signal generating unit 20 can generate the first clock signal PH1 and the second clock signal PH2 based on the frequency of the frequency-divided signal $S_{div}$, and the frequencies of the first clock signal PH1 and the second clock signal PH2 are both equal to the frequency of the frequency-divided signal $S_{div}$. Any suitable clock signal generating unit may be used and encompassed in the present disclosure.

The biasing current generating unit 21 can be configured to generate a biasing current $I_b$ based on the first clock signal PH1 and the second clock signal PH2. The intensity of the biasing current $I_b$ can be positively correlated to the frequency of the input signal $S_{in}$. At the reference voltage setup stage, the intensity of the biasing current $I_b$ can be positively correlated to the frequency of the reference signal $S_{ref}$. That is, the intensity of the biasing current $I_b$ can be increased with an increasing frequency of $S_{ref}$, and the intensity of the biasing current $I_b$ can be decreased with a decreasing frequency of $S_{ref}$. At the output signal generating stage, the intensity of the biasing current $I_b$ can be positively correlated to the frequency of the frequency-divided signal $S_{div}$. That is, the intensity of the biasing current $I_b$ can be increased with an increasing frequency of $S_{div}$; and the intensity of the biasing current $I_b$ can be decreased with a decreasing frequency of $S_{div}$.

The biasing current can flow through the resistor R from one of resistor's terminals and the control voltage $V_{ctr}$ can be generated accordingly. The other terminal of R can be connected to a reference potential. As the biasing current $I_b$ flows through the resistor R, a potential difference can be produced by the potentials at the two terminals of the resistor R. The control voltage $V_{ctr}$ can be equal to the sum of the potential difference and the reference potential. In one embodiment, the reference potential can be the ground. That is, one of the resistor R's terminals can be grounded, and the potential difference between resistor R's two terminals can thus be the control voltage $V_{ctr}$.

In one embodiment, the signal selecting unit may not be included in the oscillator circuit. An external clock selecting signal, the frequency-divided signal $S_{div}$, and the reference signal $R_{ref}$ can be introduced to the control clock signal generating unit 20 directly to generate the non-overlapping first clock signal PH1 and the second clock signal PH2.

Figure 3:
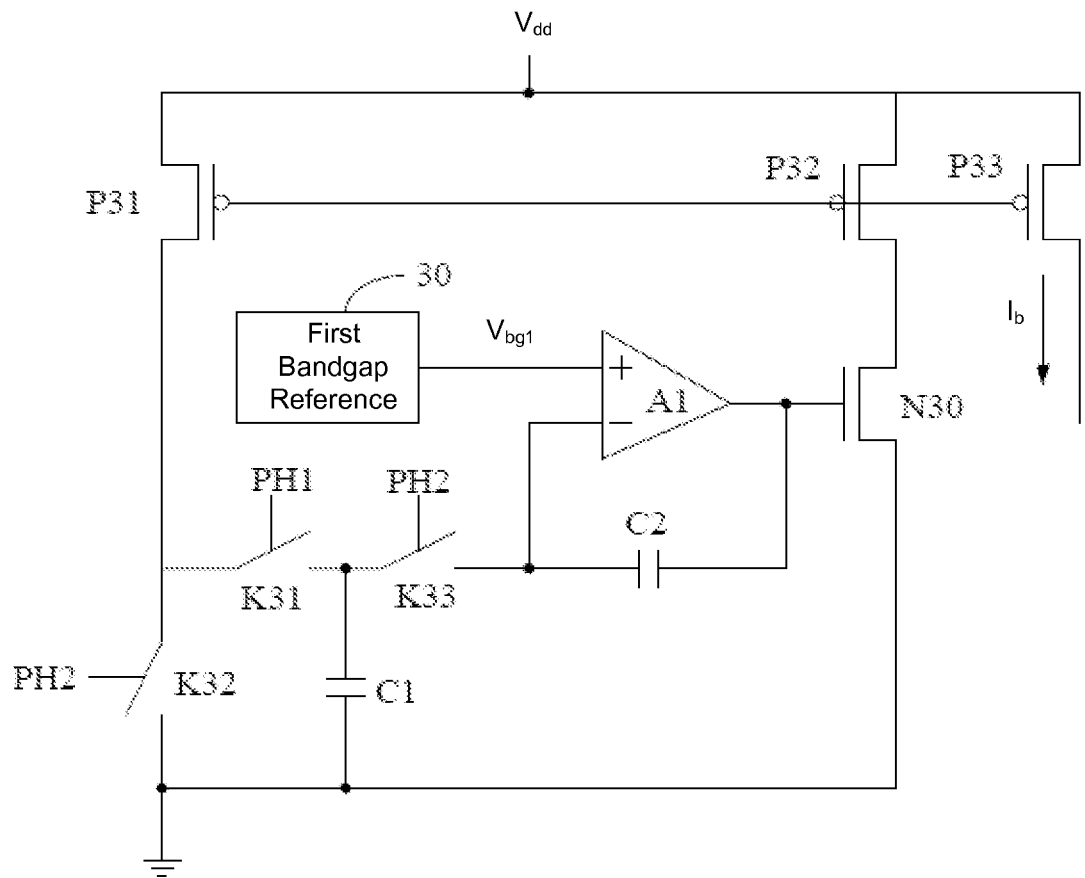
FIG. 3 illustrates an exemplary biasing current generating unit consistent with various disclosed embodiments.

Embodiments of the present disclosure further provide an exemplary circuit of the biasing current generating unit 21. As shown in FIG. 3, the biasing current generating unit 21 can include a first PMOS transistor P31, a second PMOS transistor P32, a third PMOS transistor P33, and an NMOS transistor N30. The biasing current generating unit 21 can also include a first operational amplifier A1, a first switch K31, a second switch K32, a third switch K33, a first capacitor C1, and a second capacitor C2.

Specifically, the gate of the first PMOS transistor P31 can be connected to the gate of the second PMOS transistor P32 and the gate of the third PMOS transistor P33. The source of the first PMOS transistor P31 can be connected to the source of the second PMOS transistor P32 and the source of the third PMOS transistor P33, and the sources of P31, P32, and P33 are connected to the power supply voltage $V_{dd}$. The drain of the first PMOS transistor P31 can be connected to the first terminal of the first switch K31 and the first terminal of the second switch K32.

The drain of the second PMOS transistor P32 can be connected to the drain of the NMOS transistor N30.

The drain of the third PMOS transistor P33 can be connected to one of the resistor R's terminals. That is, the drain of the third PMOS transistor P33 can be configured to output the biasing current $I_b$.

The second terminal of the first switch K31 can be connected to one of the first capacitor C1's terminals and the first terminal of the third switch K33. The control terminal of the first switch K31 can be configured to receive the first clock signal PH1.

The second terminal of the second switch K32 can be configured to be connected to the reference potential. The control terminal of the second switch K32 can be configured to receive the second clock signal PH2.

The other terminal of the first capacitor C1 can be connected to the reference potential.

The second end of the third switch K33 can be connected to the first input terminal of the first operational amplifier A1 and one terminal of the second capacitor C2. The control terminal of the third switch K33 can be configured to receive the second clock signal PH2.

The second terminal of the first operational amplifier A1 can be configured to receive the first bandgap voltage $V_{bg1}$. The output terminal of the first operational amplifier A1 can be connected to the other terminal of the second capacitor C2 and the gate of the NMOS transistor N30. It should be noted that the first terminal of the first operational amplifier A1 can be the non-inverting input terminal of the operational amplifier A1 or the inverting input terminal of the operational amplifier A1. Accordingly, the second terminal of the first operational amplifier A1 can be the inverting input terminal of the operational amplifier A1 or the non-inverting input terminal of the operational amplifier A1. In one embodiment, the first terminal of the first operational amplifier A1 can be the inverting input terminal of the operational amplifier A1, and the second terminal of the first operational amplifier A1 can be the non-inverting input terminal of the operational amplifier A1.

The source of the NMOS transistor N30 can be configured to be connected to the reference potential. In one embodiment, the reference potential can be the ground. That is, the second terminal of the second switch K32, the other terminal of the first capacitor C1, and the source of the NMOS transistor N30 are grounded.

In one embodiment, the biasing current generating unit 21 can be a switched-capacitor current source. The first PMOS transistor P31, the second PMOS transistor P32, and the third PMOS transistor P33 can form a current mirror. The first PMOS transistor P31 can be turned on or off according to the first clock signal PH1, and the second PMOS transistor P32 and the third PMOS transistor P33 can be turned on or off according to the second clock signal PH2 to charge/discharge the first capacitor C1 and the second capacitor C2. The potential difference between the first terminal and the second terminal of the first operational amplifier A1 can control the on/off state of the NMOS transistor N30 and adjust the current flowing through the second PMOS transistor P32.

Since the first clock signal PH1 and the second clock signal PH2 do not overlap with each other, when the first switch K31 is turned on, the second switch K32 and the third switch K33 can be turned off to charge the first capacitor C1 and discharge the second capacitor C2. Also, when the first switch K31 is turned off, the second switch K32 and the third switch K33 can be turned on to discharge the first capacitor C1 and charge the second capacitor C2. The first/second capacitors C1/C2 can be charged/discharged at the frequency of the first clock signal PH1 (e.g., the frequency of the input signal $S_{in}$), and the intensity of the biasing current $I_b$ can be proportional to the frequency of the input signal $S_{in}$. In one embodiment, the first clock signal PH1 and the second clock signal PH2 can each have a duty cycle of 50%, such that $i=2\times v_1 \times c_0 \times f_{in}$, where i is the intensity of the biasing current $I_b$, $v_1$ is the value of the first bandgap voltage, $c_0$ is the capacitance of the first capacitor C1, and $f_{in}$ is the frequency of the input signal $S_{in}$. Thus, the value of the control voltage $V_{ctr}$ can be calculated as $vc=2\times v_1 \times c_0 \times f_{in} \times r$, where r is the resistance of the resistor R.

The first bandgap voltage $V_{bg1}$ can be provided by an external voltage source or an internal power supply circuit of the oscillator circuit. In one embodiment, the biasing current generating unit 21 can further include a first bandgap reference 30. The first bandgap reference 30 can be configured to generate the first bandgap voltage $V_{bg1}$. Since the voltage generated by the first bandgap reference 30 is not susceptible to temperature variation, the stability of the control voltage $V_{ctr}$ can be improved.

Figure 4:
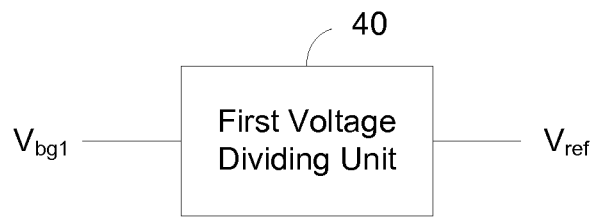
FIG. 4 illustrates an exemplary reference voltage generating unit consistent with various disclosed embodiments.

Based on the biasing current generating unit 21 provided in FIG. 3, the present disclosure further provides a circuit structure of the reference voltage generating unit 12, as shown in FIG. 4. The reference voltage generating unit 12 may include a first voltage dividing unit 40, configured to divide the first bandgap voltage $V_{bg1}$ to generate the reference voltage $V_{ref}$. At the reference voltage setup stage, the values of the control voltage $V_{ctr}$ and the first bandgap voltage $V_{bg1}$ can be accessed and the voltage dividing ratio of the first voltage dividing unit 40 can be adjusted, such that the value of the reference voltage $V_{ref}$ can be adjusted to the value of the control voltage $V_{ctr}$ at the reference voltage setup stage. In one embodiment, the first voltage dividing unit 40 can be a variable resistance. In various other embodiments, the first voltage dividing unit 40 can also be any other suitable voltage dividing circuit. Any suitable methods of voltage dividing can be encompassed in the present disclosure.

In one embodiment, the reference voltage $V_{ref}$ can be obtained by dividing the first bandgap voltage $V_{bg1}$. Since the first bandgap voltage $V_{bg1}$ is not susceptible to temperature variation, the reference voltage $V_{ref}$ can be desirably stable, and the stability of the frequency of the output signal $S_{out}$ can be improved accordingly. In addition, since the reference voltage generating unit 12 and the control voltage generating unit 11 may share the first bandgap reference 30, the production cost of the oscillation circuit can be further reduced.

Figure 5:
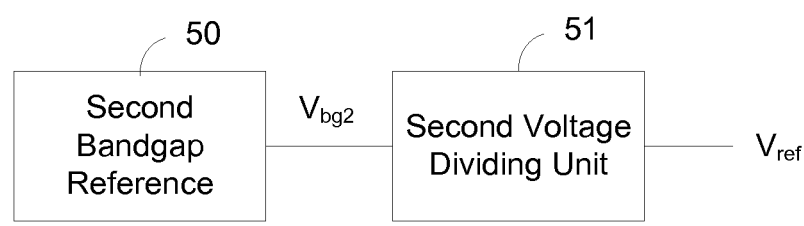
FIG. 5 illustrates another exemplary reference voltage generating unit consistent with various disclosed embodiments.

Embodiments of the present disclosure further provide a circuit structure of the reference voltage generating unit 12, as shown in FIG. 5. The reference voltage generating unit 12 can include a second bandgap reference 50 and a second voltage dividing unit 51. The second bandgap reference 50 can be configured to generate the second bandgap voltage $V_{bg2}$. The second voltage dividing unit 51 can be configured to divide the second bandgap voltage 50 to generate the reference voltage $V_{ref}$.

Figure 6:
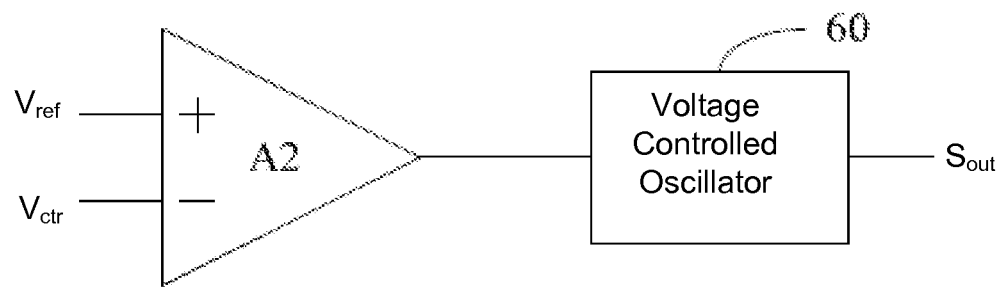
FIG. 6 illustrates an exemplary output adjusting unit consistent with various disclosed embodiments.

Embodiments of the present disclosure further provide a circuit structure of the output adjusting unit 13, as shown in FIG. 6. The output adjusting unit 13 may include a second operational amplifier A2 and a voltage controlled oscillator 60. Specifically, the first terminal of the second operational amplifier A2 can be configured to receive the control voltage $V_{ctr}$, and the second terminal of the second operational amplifier A2 can be configured to receive the reference voltage $V_{ref}$. The output terminal of the second operational terminal A2 can be connected to the input terminal of the voltage controlled oscillator 60, and the output terminal of the voltage controlled oscillator 60 can be configured to output the output signal $S_{out}$.

The first input terminal of the second operational amplifier A2 can be the non-inverting input terminal of the second operational amplifier A2 or the inverting input terminal of the second operational amplifier A2. Accordingly, the second input terminal of the second operational amplifier A2 can be the inverting input terminal of the second operational amplifier A2 or the non-inverting input terminal of the second operational amplifier A2. In one embodiment, the first terminal of the second operational amplifier A2 can be the inverting input terminal of the second operational amplifier A2, and the second terminal of the second operational amplifier A2 can be the non-inverting input terminal of the second operational amplifier A2. According to the characteristics of operational amplifiers, the second operational amplifier may amplify the differential input voltage (i.e., $(V_{ref}-V_{ctr})$) and output the amplified differential input voltage. The amplified differential input voltage can be used to adjust parameters of the voltage controlled oscillator 60 in order to enable the frequency of the output signal $S_{out}$ to vary with the differential input voltage. Methods for adjusting an amplified signal and adjusting the parameters of the voltage controlled oscillator 60 are known to those skilled in the art and are omitted herein.

Figure 7:
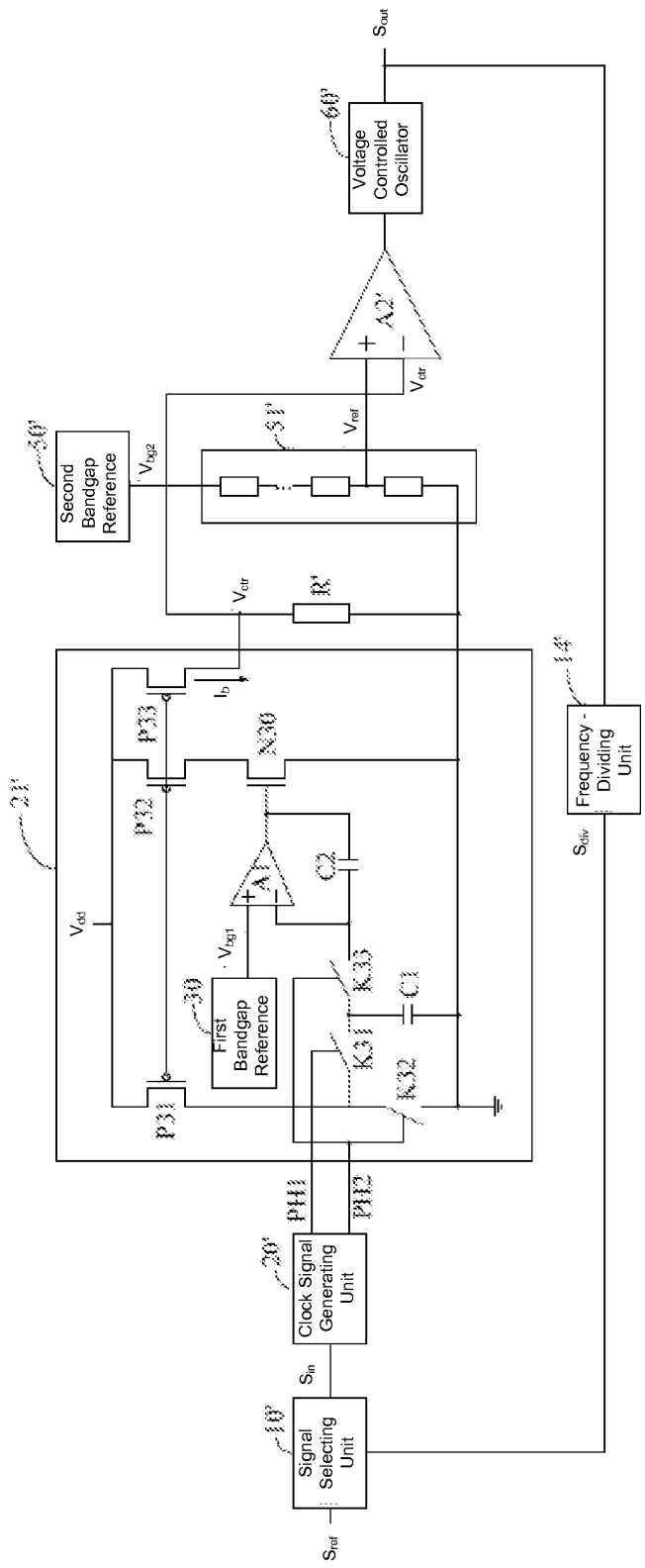
FIG. 7 illustrates structure of an exemplary oscillator circuit consistent with various disclosed embodiments.

FIG. 7 illustrates structure of an exemplary oscillator circuit disclosed in the embodiments. The oscillator circuit may include a signal selecting unit 10', a control signal generating unit, a reference voltage generating unit, an output adjusting unit, and a frequency-dividing unit 14'. The control signal generating unit may include a clock signal generating unit 20', a biasing current generating unit 21', and a resistor R'. The reference voltage generating unit may include a second bandgap reference 50' and a second voltage dividing unit 51'. The output adjusting unit may include a second operational amplifier A2' and a voltage controlled oscillator 60'. The structure and working principle of each component one are described in aforementioned embodiments and not repeated herein.

At the reference voltage setup stage, the reference signal $S_{ref}$ can be selected by the signal selecting unit 10' as the input signal $S_{in}$. The clock signal generating unit 20' may generate non-overlapping first clock signal PH1 and second clock signal PH2 based on the reference signal $S_{ref}$. The frequencies of the first clock signal PH1 and the second clock signal PH2 can both be equal to the frequency of the reference signal $S_{ref}$. The biasing current generating unit 21' may receive the first clock signal PH1 and the second clock signal PH2 to generate the biasing current $I_b$ based on the first clock signal PH1 and the second clock signal PH2. The intensity of the biasing current $I_b$ may be proportional to the frequency of the reference signal $S_{ref}$. The biasing current $I_b$ can be converted to the control voltage $V_{ctr}$ by flowing through the resistor R'. The values of the control voltage $V_{ctr}$ and the second bandgap voltage $V_{bg2}$ generated by the second bandgap voltage 50' can be accessed and used to determine the voltage dividing ratio of the second voltage dividing unit 51'. The second voltage dividing unit 51' can then generate a reference voltage $V_{ref}$ and $V_{ref}$ can be equal to the control voltage $V_{ctr}$. After the reference voltage $V_{ref}$ is generated, the second operational amplifier A2' and the voltage controlled oscillator 60' can start to generate the output signal $S_{out}$. The frequency-dividing unit 14' can divide the frequency of the output signal $S_{out}$ and output a frequency-divided signal $S_{div}$. The oscillator circuit then can operate at the output signal generating stage.

In the output signal generating stage, the signal selecting unit 10 may select the frequency-divided signal $S_{div}$ as the input signal $S_{in}$. The clock signal generating unit 20' may generate the first clock signal PH1 and second clock signal PH2 based on the frequency-divided signal $S_{div}$. The frequencies of the first clock signal PH1 and the second clock signal PH2 can both be equal to the frequency of the frequency-divided signal $S_{div}$. The biasing current generating unit 21' may receive the first clock signal PH1 and the second clock signal PH2 and generate the biasing current $I_b$, controlled by the first clock signal PH1 and the second clock signal PH2. The intensity of the biasing current $I_b$ may be proportional to the frequency of the frequency-divided signal $S_{div}$. When the frequency of frequency-divided signal $S_{div}$ is less than the frequency of the reference signal $S_{ref}$, the value of the control voltage $V_{ctr}$ is less than the value of the reference voltage $V_{ref}$. That is, the voltage difference between the reference voltage $V_{ref}$ and the control voltage $V_{ctr}$ (i.e., $(V_{ref}-V_{ctr})$) is greater than zero. The second operational amplifier A2' and the voltage controlled oscillator 60' can adjust the frequency of the output signal $S_{out}$ to increase the frequency of the output signal $S_{out}$. After the frequency of the output signal $S_{out}$ is increased, the frequency of the frequency-divided signal $S_{div}$ can be increased accordingly, the control voltage $V_{ctr}$ can be increased, and the voltage difference between the reference voltage $V_{ref}$ and the control voltage $V_{ctr}$ (i.e., $(V_{ref}-V_{ctr})$) can be decreased. When the voltage difference decreases to zero, the control voltage $V_{ctr}$ and the reference voltage $V_{ref}$ are equal, the frequency of the output signal $S_{out}$ can maintain unchanged, and the oscillator circuit can be operated at a stable state. Since the reference voltage $V_{ref}$ and the control voltage $V_{ctr}$ can both be generated by the control voltage generating unit, the frequency of the frequency-divided signal $S_{div}$ can be equal to the frequency of the reference signal $S_{ref}$ when the oscillator circuit is operated at a stable state. The frequency of the output signal $S_{out}$ can be equal to the frequency of the reference signal $S_{ref}$ multiplied by M, where M is the integer to divide the frequency of the output signal $S_{out}$ by the frequency dividing unit 14'.

Similarly, when the frequency-divided signal $S_{div}$ is greater than the frequency of the reference signal $S_{ref}$, the control voltage $V_{ctr}$ can be greater than the reference voltage $V_{ref}$. That is, the voltage difference between the reference voltage $V_{ref}$ and the control voltage $V_{ctr}$ (i.e., $(V_{ref}-V_{ctr})$) is less than zero, and the second operational amplifier A2' and the voltage control oscillator 60' can adjust the frequency of the output signal $S_{out}$ to decrease the frequency of the output signal $S_{out}$. After the frequency of the output signal $S_{out}$ is decreased, the frequency of the frequency-divided signal $S_{div}$ can decrease accordingly, the control voltage $V_{ctr}$ can be decreased, and the absolute value of the voltage difference between the reference voltage $V_{ref}$ and the control voltage $V_{ctr}$ (i.e., $(V_{ref}-V_{ctr})$) can be decreased. When the absolute value of the voltage difference decreases to zero, the values of the control voltage $V_{ctr}$ and the reference voltage $V_{ref}$ are equal, the frequency of the output signal $S_{out}$ can maintain unchanged, and the oscillator circuit operates at a stable state.

Thus, the oscillator circuit provided in the present disclosure can be realized by using known components without a crystal oscillator, so the production cost of the oscillator circuit can be reduced accordingly. Further, the oscillator circuit is a closed-loop circuit, so the output signal can be controlled and corrected in real time. Therefore, the frequency of the output signal can have desirably higher accuracy.

Compared to a conventional oscillator circuit, the present disclosure has the following advantages. For example, the oscillator circuit provided in the present disclosure uses the frequency of the reference signal to obtain the value of the reference voltage, and uses the output adjusting unit to generate the output signal based on the control voltage and the reference voltage. The frequency of the output signal is divided by the frequency-dividing unit to generate the frequency-divided signal and the frequency-divided signal is further transmitted to the control voltage generating unit to generate the control voltage. Since the frequency of the output signal maintains unchanged when the control voltage is equal to the reference voltage, and the reference voltage is generated by the control voltage generating unit based on the frequency of the reference signal, the frequency of the frequency-divided signal is equal to the frequency of the reference signal. That is, the frequency of the output signal is equal to the frequency of the reference signal multiplied by the frequency-dividing integer.

Different from a conventional oscillator circuit, the oscillator circuit provided by the present disclosure uses known components without a crystal device, and the production cost is reduced accordingly. Further, the oscillator circuit is a closed-loop circuit, and the value of the control voltage varies with the frequency of the output signal. When the frequency of the output signal changes, the output adjusting unit can control and correct the output signal in real time based on the value of the control voltage. Thus, the frequency of the output signal can have improved accuracy. Also, since the reference voltage and the control voltage are both generated by the control voltage generating unit, and frequency errors caused by device parameter deviations can be reduced. Therefore, the frequency of the output signal can be further improved.

In an embodiment, the reference voltage generating unit includes a second bandgap reference and a second voltage dividing unit. The second bandgap voltage generated by the second bandgap reference is not susceptible to temperature variation, such that the reference voltage can be more stable, and the stability of the frequency of the output signal can be improved.

In another embodiment, the reference voltage generating unit, configured to generate the reference voltage, includes a first voltage dividing unit. The reference voltage generating unit and the control voltage unit share the first bandgap reference unit. Therefore, the frequency of the output signal can be more stable, and the production cost of the oscillator circuit can be further reduced.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. An oscillator circuit, comprising:
    a signal selecting unit, configured to select a reference signal or a frequency-divided signal as an input signal;
    a control voltage generating unit, configured to generate a control voltage based on the input signal, wherein the control voltage has a value associated with a frequency of the input signal;
    a reference voltage generating unit, configured to generate a reference voltage, wherein the reference voltage has a value equal to the value of the control voltage when the input signal is the reference signal;
    an output adjusting unit, configured to generate an output signal based on the control voltage and the reference voltage, wherein the output signal has a frequency associated with a voltage difference between the reference voltage and the control voltage, and the frequency of the output signal maintains unchanged if the voltage difference is zero; and
    a frequency-dividing unit, configured to divide the frequency of the output signal and generate the frequency-divided signal.

2. The oscillator circuit according to claim 1, wherein:
    the value of the control voltage is negatively correlated to the frequency of the input signal;
    if the voltage difference is greater than zero, the frequency of the output signal decreases; and
    if the voltage difference is less than zero, the frequency of the output signal increases.

3. The oscillator circuit according to claim 1, wherein:
    the value of the control voltage is positively correlated to the frequency of the input signal;
    if the voltage difference is greater than zero, the frequency of the output signal increases; and
    if the voltage difference is less than zero, the frequency of the output signal decreases.

4. The oscillator circuit according to claim 1, wherein the control voltage generating unit includes:
    a non-overlapping clock signal generating unit, configured to generate a first clock signal and a second clock signal that are non-overlapping based on the input signal;
    a biasing current generating unit, configured to generate a biasing current based on the first clock signal and the second clock signal, wherein an intensity of the biasing current is positively correlated to the frequency of the input signal; and
    a resistor, wherein one terminal of the resistor is configured to enable the biasing current to flow through to a reference potential connected to the other terminal of the resistor to generate the control voltage.

5. The oscillator circuit according to claim 4, wherein the biasing current generating unit includes:
    a first PMOS transistor, a second PMOS transistor, a third PMOS transistor, an NMOS transistor, a first operational amplifier, a first switch, a second switch, a third switch, a first capacitor, and a second capacitor,
    wherein:
    a gate of the first PMOS transistor is connected to a gate of the second PMOS transistor and a gate of the third PMOS transistor,
    a source of the first PMOS transistor is connected to a source of the second PMOS transistor and a source of the third PMOS transistor;
    the sources of the first PMOS transistor, the second PMOS transistor, and the third PMOS transistor are connected to a power supply voltage; and
    a drain of the first PMOS transistor is connected to a first terminal of the first switch and a first terminal of the second switch;
    a drain of the second PMOS transistor is connected to a drain of the NMOS transistor;
    a drain of the third PMOS transistor is connected to one terminal of the resistor;
    a second terminal of the first switch is connected to one terminal of the first capacitor and a terminal of the third switch, and a control terminal of the first switch receives the first clock signal;
    a second terminal of the second switch is connected to the reference potential, and a control terminal of the second switch receives the second clock signal;
    an other terminal of the first capacitor is connected to the reference potential;
    a second terminal of the third switch is connected to a first input terminal of the first operational amplifier and one terminal of the second capacitor, and a control terminal of the third switch receives the second clock signal; and
    a second terminal of the first operational amplifier is configured to receive the first bandgap voltage, and an output of the first operational amplifier is connected to the other terminal of the second capacitor and a gate of the NMOS transistor.

6. The oscillator circuit according to claim 5, wherein the biasing current unit further includes a first bandgap reference, configured to generate a first bandgap voltage.

7. The oscillator circuit according to claim 6, wherein the reference voltage generating unit includes: a first voltage dividing unit, configured to divide the first bandgap voltage to generate the reference voltage.

8. The oscillator circuit according to claim 7, wherein the first voltage dividing unit includes a variable resistance.

9. The oscillator circuit according to claim 5, wherein the reference potential is the ground.

10. The oscillator circuit according to claim 1, wherein the reference voltage generating unit includes:
   a second bandgap reference, configured to generate a second bandgap voltage; and
   a second voltage dividing unit, configured to divide the second bandgap voltage to generate the reference voltage.

11. The oscillator circuit according to claim 1, wherein:
   the output adjusting unit includes a second operational amplifier and a voltage controlled oscillator;
   a first terminal of the second operational amplifier receives the control voltage as the input signal, a second terminal of the second operational amplifier receives the reference voltage, and an output of the second operational amplifier is connected to an input terminal of the voltage controlled oscillator; and
   an output terminal of the voltage controlled oscillator is configured to output the output signal.

12. The oscillator circuit according to claim 1, wherein the signal selecting unit is configured to select the reference signal as the input signal at a reference voltage setup stage; and to select the frequency-divided signal as the input signal at an output signal generating stage.

13. A method for configuring an oscillator circuit, comprising:
   configuring a signal selecting unit to select a reference signal or a frequency-divided signal as an input signal;
   configuring a control voltage generating unit to generate a control voltage based on the input signal, wherein the control voltage has a value associated with a frequency of the input signal;
   configuring a reference voltage generating unit to generate a reference voltage, wherein the reference voltage has a value equal to the value of the control voltage when the input signal is the reference signal;
   configuring an output adjusting unit to generate an output signal based on the control voltage and the reference voltage, wherein the output signal has a frequency associated with a voltage difference between the reference voltage and the control voltage, and the frequency of the output signal maintains unchanged if the voltage difference is zero; and
   configuring a frequency-dividing unit to divide the frequency of the output signal and generate the frequency-divided signal.

14. The method according to claim 13, wherein:
   the value of the control voltage is negatively correlated to the frequency of the input signal;
   if the voltage difference is greater than zero, the frequency of the output signal decreases; and
   if the voltage difference is less than zero, the frequency of the output signal increases.

15. The method according to claim 13, wherein:
   the value of the control voltage is positively correlated to the frequency of the input signal;
   if the voltage difference is greater than zero, the frequency of the output signal increases; and
   if the voltage difference is less than zero, the frequency of the output signal decreases.

16. The method according to claim 13, wherein the control voltage generating unit includes:
   a non-overlapping clock signal generating unit, configured to generate a first clock signal and a second clock signal that are non-overlapping based on the input signal;
   a biasing current generating unit, configured to generate a biasing current based on the first clock signal and the second clock signal, wherein an intensity of the biasing current is positively correlated to the frequency of the input signal; and
   a resistor, wherein one terminal of the resistor is configured to enable the biasing current to flow through to a reference potential connected to the other terminal of the resistor to generate the control voltage.

17. The method according to claim 16, wherein the biasing current generating unit includes:
   a first PMOS transistor, a second PMOS transistor, a third PMOS transistor, an NMOS transistor, a first operational amplifier, a first switch, a second switch, a third switch, a first capacitor, and a second capacitor,
   wherein:
   a gate of the first PMOS transistor is connected to a gate of the second PMOS transistor and a gate of the third PMOS transistor,
   a source of the first PMOS transistor is connected to a source of the second PMOS transistor and a source of the third PMOS transistor;
   the sources of the first PMOS transistor, the second PMOS transistor, and the third PMOS transistor are connected to a power supply voltage; and
   a drain of the first PMOS transistor is connected to a first terminal of the first switch and a first terminal of the second switch;
   a drain of the second PMOS transistor is connected to a drain of the NMOS transistor;
   a drain of the third PMOS transistor is connected to one terminal of the resistor;
   a second terminal of the first switch is connected to one terminal of the first capacitor and a terminal of the third switch, and a control terminal of the first switch receives the first clock signal;
   a second terminal of the second switch is connected to the reference potential, and a control terminal of the second switch receives the second clock signal;
   an other terminal of the first capacitor is connected to the reference potential;
   a second terminal of the third switch is connected to a first input terminal of the first operational amplifier and one terminal of the second capacitor, and a control terminal of the third switch receives the second clock signal; and
   a second terminal of the first operational amplifier is configured to receive the first bandgap voltage, and an output of the first operational amplifier is connected to the other terminal of the second capacitor and a gate of the NMOS transistor.

18. The method according to claim 17, wherein the biasing current unit further includes a first bandgap reference, configured to generate a first bandgap voltage.

19. The method according to claim 18, wherein the reference voltage generating unit includes: a first voltage dividing unit, configured to divide the first bandgap voltage to generate the reference voltage.

20. The method according to claim 13, wherein the reference voltage generating unit includes:
   a second bandgap reference, configured to generate a second bandgap voltage; and a second voltage dividing unit, configured to divide the second bandgap voltage to generate the reference voltage.

\* \* \* \* \*